(12) United States Patent
Forbes et al.

(10) Patent No.: US 7,084,451 B2
(45) Date of Patent: Aug. 1, 2006

(54) CIRCUITS WITH A TRENCH CAPACITOR HAVING MICRO-ROUGHENED SEMICONDUCTOR SURFACES

(75) Inventors: Leonard Forbes, Corvallis, OR (US); Joseph E. Geusic, Berkeley Heights, NJ (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/467,992

(22) Filed: Dec. 20, 1999

(65) Prior Publication Data

US 2001/0035549 A1    Nov. 1, 2001

Related U.S. Application Data

(62) Division of application No. 09/010,729, filed on Jan. 22, 1998, now Pat. No. 6,025,225.

(51) Int. Cl.
*H01L 27/108* (2006.01)

(52) U.S. Cl. .................. 257/309; 257/296; 257/301

(58) Field of Classification Search ................ 257/301, 257/309, 296
See application file for complete search history.

(56) References Cited

U.S. PATENT DOCUMENTS

| | | | | |
|---|---|---|---|---|
| 4,051,354 | A | 9/1977 | Choate | 235/312 |
| 4,252,579 | A | 2/1981 | Ho et al. | 148/174 |
| 4,604,162 | A | 8/1986 | Sobczak | 156/657 |
| 4,663,831 | A | 5/1987 | Birrittella et al. | 29/576 E |
| 4,673,962 | A | 6/1987 | Chatterjee et al. | 357/23.6 |
| 4,761,385 | A * | 8/1988 | Pfiester | 437/52 |
| 4,761,768 | A | 8/1988 | Turner et al. | 365/201 |
| 4,766,569 | A | 8/1988 | Turner et al. | 365/185 |
| 4,906,590 | A * | 3/1990 | Kanetaki et al. | 437/52 |
| 4,920,065 | A | 4/1990 | Chin et al. | 437/52 |
| 4,920,389 | A * | 4/1990 | Itoh | 257/302 |
| 4,929,988 | A | 5/1990 | Yoshikawa | 357/23.5 |
| 4,958,318 | A | 9/1990 | Harari | 365/149 |
| 4,987,089 | A | 1/1991 | Roberts | 437/34 |
| 5,001,526 | A | 3/1991 | Gotou | 357/23.6 |
| 5,006,909 | A | 4/1991 | Kosa | 357/23.6 |
| 5,017,504 | A | 5/1991 | Nishimura et al. | 437/40 |
| 5,021,355 | A | 6/1991 | Dhong et al. | 437/35 |
| 5,028,977 | A | 7/1991 | Kenneth et al. | 357/43 |
| 5,057,896 | A | 10/1991 | Gotou | 357/49 |
| 5,072,269 | A | 12/1991 | Hieda | 357/23.6 |
| 5,102,817 | A | 4/1992 | Chatterjee et al. | 437/47 |
| 5,110,752 | A | 5/1992 | Lu | 437/47 |

(Continued)

FOREIGN PATENT DOCUMENTS

EP    0198590    10/1986

(Continued)

OTHER PUBLICATIONS

Rhyne, *In: Fundamentals of Digital Systems Design*, Prentice Hall, New Jersey, (1973), p. 70-71.

(Continued)

*Primary Examiner*—Eugene Lee
(74) *Attorney, Agent, or Firm*—Schwegman, Lundberg, Woessner & Kluth, P.A.

(57) ABSTRACT

A method for forming a trench capacitor. The method includes forming a trench in a semiconductor substrate. A conformal layer of semiconductor material is deposited in the trench. The surface of the conformal layer of semiconductor material is roughened. An insulator layer is formed outwardly from the roughened, conformal layer of semiconductor material. A polycrystalline semiconductor plate is formed outwardly from the insulator layer in the trench.

25 Claims, 5 Drawing Sheets

U.S. PATENT DOCUMENTS

| | | |
|---|---|---|
| 5,128,831 A | 7/1992 | Fox, III et al. |
| 5,156,987 A | 10/1992 | Sandhu et al. ............... 437/40 |
| 5,177,028 A | 1/1993 | Manning .................... 437/41 |
| 5,177,576 A | 1/1993 | Kimura et al. ............... 257/71 |
| 5,181,089 A | 1/1993 | Matsuo et al. .............. 257/299 |
| 5,191,509 A * | 3/1993 | Wen ........................... 361/311 |
| 5,202,278 A | 4/1993 | Mathews et al. ............. 437/47 |
| 5,208,657 A | 5/1993 | Chatterjee et al. .......... 257/302 |
| 5,216,266 A | 6/1993 | Ozaki ......................... 257/302 |
| 5,220,530 A | 6/1993 | Itoh ...................... 365/189.01 |
| 5,223,081 A | 6/1993 | Doan ......................... 156/628 |
| 5,266,514 A | 11/1993 | Tuan et al. ................... 437/52 |
| 5,292,676 A | 3/1994 | Manning .................... 437/46 |
| 5,316,962 A | 5/1994 | Matsuo et al. ............... 437/52 |
| 5,320,880 A | 6/1994 | Sandhu et al. .............. 427/578 |
| 5,327,380 A | 7/1994 | Kersh, III et al. .......... 365/195 |
| 5,363,325 A | 11/1994 | Sunouchi et al. ........... 365/149 |
| 5,365,477 A | 11/1994 | Cooper, Jr. et al. ......... 365/174 |
| 5,376,575 A | 12/1994 | Kim et al. .................... 437/52 |
| 5,379,255 A | 1/1995 | Shah .......................... 365/185 |
| 5,382,540 A | 1/1995 | Sharma et al. ............... 437/52 |
| 5,385,854 A | 1/1995 | Batra et al. ................... 437/41 |
| 5,391,911 A | 2/1995 | Beyer et al. ................ 257/522 |
| 5,392,245 A | 2/1995 | Manning .................... 365/200 |
| 5,393,704 A | 2/1995 | Huang et al. ............... 437/203 |
| 5,396,093 A | 3/1995 | Lu .............................. 257/306 |
| 5,396,452 A * | 3/1995 | Wahlstrom .................. 365/149 |
| 5,409,563 A | 4/1995 | Cathey ....................... 156/643 |
| 5,410,169 A | 4/1995 | Yamamoto et al. ......... 257/301 |
| 5,414,287 A | 5/1995 | Hong .......................... 257/316 |
| 5,422,499 A | 6/1995 | Manning ..................... 257/67 |
| 5,427,972 A | 6/1995 | Shimizu et al. .............. 437/52 |
| 5,429,955 A | 7/1995 | Joyner et al. ................. 437/26 |
| 5,432,739 A | 7/1995 | Pein ............................ 365/185 |
| 5,438,009 A | 8/1995 | Yang et al. ................... 437/52 |
| 5,440,158 A | 8/1995 | Sung-Mu .................... 257/314 |
| 5,445,986 A | 8/1995 | Hirota ......................... 437/60 |
| 5,451,538 A | 9/1995 | Fitch et al. ................... 487/60 |
| 5,451,889 A | 9/1995 | Heim et al. ................... 326/81 |
| 5,460,316 A | 10/1995 | Hefele ......................... 228/39 |
| 5,460,988 A | 10/1995 | Hong .......................... 437/43 |
| 5,466,625 A | 11/1995 | Hsieh et al. .................. 437/52 |
| 5,483,094 A | 1/1996 | Sharma et al. .............. 257/316 |
| 5,483,487 A | 1/1996 | Sung-Mu ................ 365/185.33 |
| 5,492,853 A | 2/1996 | Jeng et al. .................... 437/60 |
| 5,495,441 A | 2/1996 | Hong .................... 365/185.01 |
| 5,497,017 A | 3/1996 | Gonzales .................... 257/306 |
| 5,502,629 A | 3/1996 | Ito et al. ....................... 363/60 |
| 5,504,357 A | 4/1996 | Kim et al. ................... 257/306 |
| 5,508,219 A | 4/1996 | Bronner et al. .............. 437/52 |
| 5,508,542 A | 4/1996 | Geiss et al. ................. 257/301 |
| 5,519,236 A | 5/1996 | Ozaki ......................... 257/302 |
| 5,528,062 A | 6/1996 | Hsieh et al. ................. 257/298 |
| 5,528,173 A | 6/1996 | Merritt et al. ................ 326/80 |
| 5,563,083 A | 10/1996 | Pein ............................ 437/43 |
| 5,574,299 A | 11/1996 | Kim ............................ 257/296 |
| 5,593,912 A | 1/1997 | Rajeevakumar ............. 437/52 |
| 5,612,559 A | 3/1997 | Park et al. ................... 257/302 |
| 5,616,934 A | 4/1997 | Dennison et al. ............ 257/67 |
| 5,640,342 A | 6/1997 | Gonzalez .................... 365/156 |
| 5,640,350 A | 6/1997 | Iga .............................. 365/186 |
| 5,641,545 A | 6/1997 | Sandhu ....................... 427/573 |
| 5,644,540 A | 7/1997 | Manning .................... 365/230 |
| 5,646,900 A | 7/1997 | Tsukude et al. ............. 365/205 |
| 5,691,230 A | 11/1997 | Forbes ........................ 437/62 |
| 5,696,011 A | 12/1997 | Yamazaki et al. ........... 437/40 |
| 5,705,415 A | 1/1998 | Orlowski et al. ............ 437/43 |
| 5,714,793 A | 2/1998 | Cartagena et al. .......... 257/507 |
| 5,731,609 A * | 3/1998 | Hamamoto et al. ......... 257/302 |
| 5,760,434 A * | 6/1998 | Zahurak et al. ............. 257/309 |
| 5,789,967 A | 8/1998 | Katoh ......................... 327/408 |
| 5,801,413 A * | 9/1998 | Pan ............................. 257/301 |
| 5,821,796 A | 10/1998 | Yaklin et al. ................ 327/313 |
| 5,852,375 A | 12/1998 | Byrne et al. ................. 327/108 |
| 5,874,760 A | 2/1999 | Burns, Jr. et al. ........... 257/315 |
| 5,877,061 A * | 3/1999 | Halle et al. .................. 438/386 |
| 5,879,971 A | 3/1999 | Witek ......................... 438/238 |
| 5,909,618 A * | 6/1999 | Forbes et al. ............... 438/242 |
| 5,933,717 A | 8/1999 | Hause et al. ................ 438/200 |
| 5,981,995 A | 11/1999 | Selcuk ........................ 257/330 |
| 5,998,820 A | 12/1999 | Chi et al. .................... 257/296 |
| 6,016,268 A | 1/2000 | Worley ........................ 365/149 |
| 6,040,210 A | 3/2000 | Burns, Jr. et al. ........... 438/238 |
| 6,040,218 A | 3/2000 | Lam ............................ 438/259 |
| 6,121,084 A * | 9/2000 | Coursey ...................... 438/255 |
| 6,143,636 A | 11/2000 | Forbes et al. ............... 438/257 |
| 6,150,687 A | 11/2000 | Noble et al. ................. 257/302 |
| 6,165,836 A | 12/2000 | Forbes et al. ............... 438/243 |
| 6,172,391 B1 | 1/2001 | Goebel ........................ 257/305 |
| 6,172,535 B1 | 1/2001 | Hopkins ....................... 327/66 |
| 6,181,121 B1 | 1/2001 | Kirkland et al. ............. 323/313 |
| 6,181,196 B1 | 1/2001 | Nguyen ....................... 327/539 |
| 6,208,164 B1 | 3/2001 | Noble et al. ................... 326/41 |
| 6,221,788 B1 * | 4/2001 | Kobayashi et al. ......... 438/762 |
| 6,238,976 B1 | 5/2001 | Noble et al. ................. 438/259 |
| 6,255,708 B1 * | 7/2001 | Sudharsanan et al. ...... 257/428 |
| 6,323,719 B1 | 11/2001 | Chang et al. ................ 327/478 |
| 6,433,382 B1 | 8/2002 | Orlowski et al. ............ 257/315 |
| 6,498,065 B1 | 12/2002 | Forbes et al. ............... 438/259 |
| 6,528,837 B1 | 3/2003 | Forbes et al. ............... 257/302 |

FOREIGN PATENT DOCUMENTS

| | | | |
|---|---|---|---|
| JP | 63066963 | 3/1988 | |
| JP | 363066963 A | 3/1988 | ................ 257/305 |
| JP | 11-135757 | 5/1999 | |
| JP | 2000164883 | * 6/2000 | |

OTHER PUBLICATIONS

Adler, E., et al., "The Evolution of IBM CMOS DRAM Technology", 167-188, (Jan./Mar., 1995).

Asai, S., et al., "Technology Challenges for Integration Near and Below 0.1 micrometer", *Proceedings of the IEEE*, 85, Special Issue on Nanometer-Scale Science & Technology, 505-520, (Apr. 1997).

Banerjee, S.K., et al., "Characterization of Trench Transistors for 3-D Memories", *1986 Symposium on VLSI Technology, Digest of Technical Papers*, San Diego, CA, 79-80, (May 28-30, 1986).

Blalock, T.N., et al., "A High-Speed Sensing Scheme for 1T Dynamic RAM's Utilizing the Clamped Bit-Line Sense Amplifier", *IEEE Journal of Solid-State Circuits*, 27 (4), pp. 618-624, (Apr. 1992).

Bomchil, G., et al., "Porus Silicon: The Material and its Applications in Silicon-On-Insulator Technologies", *Applied Surface Science*, 41/42, 604-613, (1989).

Burnett, D., et al., "Implications of Fundamental Threshold Voltage Variations for High-Density SRAM and Logic Circuits", *1994 Symposium on VLSI Technology, Digest of Technical Papers*, Honolulu, HI, 15-16, (Jun. 4-7, 1994).

Burnett, D., et al., "Statistical Threshold-Voltage Variation and its Impact on Supply-Voltage Scaling", *Proceedings SPIE: Microelectronic Device and Multilevel Interconnection Technology*, 2636, 83-90, (1995).

Chen, M.J., et al., "Back-Gate Forward Bias Method for Low-Voltage CMOS Digital Circuits", *IEEE Transactions on Electron Devices*, 43, 904-909, (Jun. 1986).

Chen, M.J., et al., "Optimizing the Match in Weakly Inverted MOSFET's by Gated Lateral Bipolar Action",

*IEEE Tranactions on Electron Devices*, 43, 766-773, (May 1996).

Chung, I.Y., et al., "A New SOI Inverter for Low Power Applications", *Procedings of the 1996 IEEE International SOI Conference*, Sanibel Island, FL, 20-21, (Sep. 30-Oct. 3, 1996).

De, V.K., et al., "Random MOSFET Parameter Fluctuation Limits to Gigascale Integration (GSI) ", *1996 Symposium on VLSI Technology, Digest of Technical Papers*, Honolulu, HI, 198-199, (Jun. 11-13, 1996).

Denton, J.P., et al., "Fully Depleted Dual—Gated Thin-Film SOI P-MOSFET's Fabricated in SOI Islands with an Isolated Buried Polysilicon Backgate", *IEEE Electron Device Letters*, 17(11), 509-511, (Nov. 1996).

Fong, Y., et al., "Oxides Grown on Textured Single-Crystal Silicon—Dependence on Process and Application in EEPROMs", *IEEE Transactions on Electron Devices*, 37(3), pp. 583-590, (Mar. 1990).

Forbes, L., et al., "Resonant Forward-Biased Guard-Ring Diodes for Suppression of Substrate Noise in Mixed-Mode CMOS Circuits", *Electronics Letters, 31*, 720-721, (Apr. 1995).

Foster, R., et al., "High Rate Low-Temperature Selective Tungsten", *In: Tungsten and Other Refractory Metals for VLSI Applications III*, V.A. Wells, ed., Materials Res. Soc., Pittsburgh, PA, 69-72, (1988).

Fuse, T., et al., "A 0.5V 200MHz 1-Stage 32b ALU Using a Body Bias Controlled SOI Pass-Gate Logic", *1997 IEEE International Solid-State Circuits Conference, Digest of Technical Papers*, 286-287, (1997).

Gong, S., et al., "Techniques for Reducing Switching Noise in High Speed Digital Systems", *Proceedings of the 8th Annual IEEE International ASIC Conference and Exhibit*, 21-24, (1995).

Hao, M.Y., et al., "Electrical Characteristics of Oxynitrides Grown on Textured Single-Crystal Silicon", *Appl. Phys. Lett.*, 60, 445-447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI 96-97, (Jun. 11-13, 1996).

Heavens, O., *Optical Properties of Thin Solid Films*, Dover Pubs. Inc., New York, 167, (1965).

Hisamoto, D., et al., "A New Stacked Cell Structure for Giga-Bit DRAMs using Vertical Ultra-Thin SOI (DELTA) MOSFETs", *1991 IEEE International Electron Devices Meeting, Technical Digest*, Washington, D.C., 959-961, (Dec. 8-11, 1991).

Hodges, D.A., et al., "MOS Decoders", *In: Analysis and Design of Digital Integrated Circuits, 2nd Edition*, Section: 9.1.3, 354-357, (1988).

Holman, W.T., et al., "A Compact Low Noise Operational Amplifier for a 1.2 Micrometer Digital CMOS Technology", *IEEE Journal of Solid-State Circuits*,30, 710-714, (Jun. 1995).

Horie, H., et al., "Novel High Aspect Ratio Aluminum Plug for Logic/DRAM LSI's Using Polysilicon-Aluminum Substitute", *Technical Digest: IEEE International Electron Devices Meeting*, San Francisco, CA 946-948, (1996).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506-512, (Mar. 1995).

Jun, Y.K., et al., "The Fabrication and Electrical Properties of Modulated Stacked Capacitor for Advanced DRAM Applications", *IEEE Electron Device Letters*, 13, 430-432, (Aug. 1992).

Jung, T.S., et al., "A 117-mm2 3.3-V Only 128-Mb Multilevel NAND Flash Memory for Mass Storage Applications", *IEEE Journal of Solid-State Circuits*, 31, 1575-1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA 635-638, (Dec. 11-14, 1994).

Kim, Y.S., et al., "A Study on Pyrolysis DMEAA for Selective Deposition of Aluminum",*In: Advanced Metallization and Interconnect Systems for ULSI Applications in 1995*, R.C. Ellwanger, et al., (eds.), Materials Research Society, Pittsburgh, PA, 675-680, (1996).

Kishimoto, T., et al., "Well Structure by High-Energy Boron Implantation for Soft-Error Reduction in Dynamic Random Access Memories (DRAMs)", *Japanese Journal of Applied Physics*, 34, 6899-6902, (Dec. 1995).

Klaus, et al., "Atomic Layer Controlled Growth of SiO2 Films Using Binary Reaction Sequence Chemistry", *Applied Physics Lett. 70 (9)*, 1092-94, (Mar. 3, 1997).

Kohyama, Y., et al., "Buried Bit—Line Cell for 64MB DRAMs", *1990 Symposium on VLSI Technology, Digest of Technical Papers*, Honolulu, HI, 17-18, (Jun. 4-7, 1990).

Koshida, N., et al., "Efficient Visible Photoluminescence from Porous Silicon", *Japanese Journal of Applied Physics*, 30, L1221—L1223, (Jul. 1991).

Kuge, S., et al., "SOI-DRAM Circuit Technologies for Low Power High Speed Multigiga Scale Memories", *IEEE Journal of Solid-State Circuits*, 31(4), pp. 586-591, (Apr. 1996).

Lantz, II, L., "Soft Errors Induced By Alpha Particles", *IEEE Transactions on Reliability*, 45, 174-179, (Jun. 1996).

Lehmann, et al., "A Novel Capacitor Technology Based on Porous Silicon", *Thin Solid Films 276, Elsevier Science*, 138-42, (1996).

Lehmann, V., "The Physics of Macropore Formation in Low Doped n-Type Silicon", *Journal of the Electrochemical Society*, 140 (10), 2836-2843, (Oct. 1993).

Lu, N., et al., "The SPT Cell—A New Substrate-Plate Trench Cell for DRAMs", *1985 IEEE International Electron Devices Meeting, Technical Digest*, Washington, D.C., 771-772, (Dec. 1-4, 1985).

MacSweeney, D., et al., "Modelling of Lateral Bipolar Devices in a CMOS Process", *IEEE Bipolar Circuits and Technology Meeting*, Minneapolis, MN, 27-30, (Sep. 1996).

Maeda, S., et al., "A Vertical Phi-Shape Transistors (VPhiT) Cell for 1 Gbit DRAM and Beyond", *1994 Symposium of VLSI Technology, Digest of Technical Papers*, Honolulu, HI, 133-134, (Jun. 7-9, 1994).

Maeda, S., et al., "Impact of a Vertical Phi-Shape Transistor (VPhiT) Cell for 1 Gbit DRAM and Beyond", *IEEE Transactions on Electron Devices*, 42, 2117-2123, (Dec. 1995).

Malaviya, S., *IBM TBD*, 15, p. 42, (Jul. 1972).

Masu, K., et al., "Multilevel Metallization Based on Al CVD", *1996 IEEE Symposium on VLSI Technology, Digest of Technical Papers*, Honolulu, HI, 44-45, (Jun. 11-13, 1996).

McCredic, B.D., et al., "Modeling, Measurement, and Simulation of Simultaneous Switching Noise", *IEEE Transactions on Components, Packaging, and Manufacturing Technology—Part B*, 19, 461-472, (Aug. 1996).

Muller, K., et al., "Trench Storage Node Technology for Gigabit DRAM Generations", *Digest IEEE International Electron Devices Meeting*, San Francisco, CA, 507-510, (Dec. 1996).

Nitayama, A., et al., "High Speed and Compact CMOS Circuits with Multipillar Surrounding Gate Transistors", *IEEE Transactions on Electron Devices*, 36, 2605-2606, (Nov. 1989).

Ohba, T., et al., "Evaluation on Selective Deposition of CVD W Films by Measurement of Surface Temperature", *In: Tungsten and Other Refractory Metals for VLSI Applictions II*, Materials Research Society, Pittsburgh, PA, 59-66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA 17-25, (1989).

Ohno, Y., et al., "Estimation of the Charge Collection for the Soft-Error Immunity by the 3D-Device Simulation and the Quantitative Investigation", *Simulation of Semiconductor Devices and Processes*, 6, 302-305, (Sep. 1995).

Oowaki, Y., et al., "New alpha-Particle Induced Soft Error Mechanism in a Three Dimensional Capacitor Cell", *IEICE Transactions on Electronics*, 78-C, 845-851, (Jul. 1995).

Oshida, S., et al., "Minority Carrier Collection in 256 M-bit DRAM Cell on Incidence of Alpha-Particle Analyzed by Three-Dimensional Device Simulation", *IEICE Transactions on Electronics*, 76-C, 1604-1610, (Nov. 1993).

Ott, A.W., et al., "A1303 Thin Film Growth on Si(100) Using Binary Reaction Sequence Chemistry", *Thin Solid Films*, vol. 292, 135-44, (1997).

Ozaki, T., et al., "A Surrounding Isolation-Merged Plate Elecrode (SIMPLE) Cell with Checkered Layout for 256Mbit DRAMs and Beyond", *1991 IEEE International Electron Devices Meeting*, Washington, D.C., 469-472, (Dec. 8-11, 1991).

Parke, S.A., et al., "A High-Performance Lateral Bipolar Transistor Fabricated on SIMOX", *IEEE Electron Device Letters*, 14, 33-35, (Jan. 1993).

Pein, H., et al., "A 3-D Sidewall Flash EPROM Cell and Memory Array", *IEEE Transactions on Electron Devices*, 40, 2126-2127, (Nov. 1993).

Pein, H., et al., "Performance of the 3-D PENCIL Flash EPROM Cell and Memory Array", *IEEE Transactions on Electron Devices*, 42, 1982-1991, (Nov. 1995).

Pein, H.B., et al., "Performance of the 3-D Sidewall Flash EPROM Cell", *IEEE International Electron Devices Meeting, Technical Digest*, 11-14, (1993).

Ramo, S., et al., "Fields and Waves in Communication Electronics",*John Wiley & Son, Inc., New York, 3rd ed.*, 428-433.

Rao, K.V., et al., "Trench Capacitor Design Issues in VLSI DRAM Cells", *1986 IEEE International Electron Devices Meeting, Technical Digest*, Los Angeles, CA, 140-143, (Dec. 7-10, 1986).

Richardson, W.F., et al., "A Trench Transistor Cross-Point DRAM Cell", *IEEE International Electron Devices Meeting*, Washington, D.C., 714-717, (Dec. 1-4, 1985).

Sagara, K., et al., "A 0.72 micro-meter2 Recessed STC (RSTC) Technology for 256Mbit DRAMs using Quarter-Micron Phase-Shift Lithography", *1992 Symposium on VLSI Technology, Digest of Technical Papers*, Seattle, WA, 10-11, (Jun. 2-4, 1992).

Saito, M., et al., "Technique for Controlling Effective Vth in Multi-Gbit DRAM Sense Amplifier", *1996 Symposium on VLSI Circuits, Digest of Technical Papers*, Honolulu, HI, 106-107, (Jun. 13-15, 1996).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, 1765-1773, (Sep. 1994).

Shah, A.H., et al., "A 4-Mbit DRAM with Trench-Transistor Cell", *IEEE Journal of Solid-State Circuits*, SC-21, 618-625, (Oct. 1986).

Shah, A.H., et al., "A 4Mb DRAM with Cross-Point Trench Transistor Cell", *1986 IEEE International Solid-State Circuits Conference, Digest of Technical Papers*, 268-269, (Feb. 21, 1986).

Sherony, M.J., et al., "Reduction of Threshold Voltage Sensitivity in SOI MOSFET's", *IEEE Electron Device Letters*, 16, 100-102, (Mar. 1995).

Shimomura, K., et al., "A 1V 46ns 16Mb SOI-DRAM with Body Control Technique", *1997 IEEE International Solid-State Circuits Conference, Digest of Technical Papers*, 68-69, (Feb. 6, 1997).

Stanisic, B.R., et al., "Addressing Noise Decoupling in Mixed-Signal IC's: Power Distribution Design and Cell Customization", *IEEE Journal of Solid-State Circuits*, 30, 321-326, (Mar. 1995).

Stellwag, T.B., et al., "A Vertically-Integrated GaAs Bipolar DRAM Cell", *IEEE Transactions on Electron Devices*, 38, 2704-2705, (Dec. 1991).

Suma, K., et al., "An SOI-DRAM with Wide Operating Voltage Range by CMOS/SIMOX Technology", *IEEE Journal of Solid-State Circuits*, 29(11), pp. 1323-1329, (Nov. 1944).

Sunouchi, K., et al., "A Surrounding Gate Transistor (SGT) Cell for 64/256Mbit DRAMs", *1989 IEEE International Electron Devices Meeting, Technical Digest*, Washington, D.C., 23-26, (Dec. 3-6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA 647-650, (Dec. 9-12, 1990).

Suntola, T., "Atomic Layer Epitaxy", *Handbook of Crystal Growth 3, Thin Films of Epitaxy, Part B: Growth Mechanics and Dynamics, Elsevier, Amsterdam*, 601-63, (1994).

Sze, S.M., *VLSI Technology, 2nd Edition, Mc Graw-Hill*, NY, 90, (1988).

Takai, M., et al., "Direct Measurement and Improvement of Local Soft Error Susceptibility in Dynamic Random Access Memories", *Nuclear Instruments & Methods in Physics Research*, B-99, Proceedings of the 13th International Conference on the Application of Accelerators in Research and Industry, Denton, TX, 562-565, (Nov. 7-10, 1994).

Takato, H., et al., "High Performance CMOS Surrounding Gate Transistor (SGT) for Ultra High Density LSIs", *IEEE International Electron Devices Meeting, Technical Digest*, 222-225, (1988).

Takato, H., et al., "Impact of Surrounding Gate Transistor (SGT) for Ultra-High Density LSI's", *IEEE Transactions on Electron Devices*, 38, 573-578, (Mar. 1991).

Tanabe, N.; et al., "A Ferroelectric Capacitor Over Bit-Line (F-COB) Cell for High Density Nonvolatile Ferroelectric Memories", *1995 Symposium on VLSI Technology, Digest of Technical Papers*, Kyoto, Japan, 123-124, (Jun. 6-8, 1995).

Wang, N., *Digital MOS Integrated Circuits*, Prentice Hall, Inc., Englewood Cliffs, NJ, p. 328-333, (1989).

Terauchi, M., et al., "A Surrounding Gate Transistor (SGT) Gain Cell for Ultra High Density DRAMs", *1993 Symposium on VLSI Technology Technology, Digest of Technical Paper*, Kyoto, Japan, 21-22, (1993).

Tsui, P.G., et al., "A Versatile Half-Micron Complementary BiCMOS Technology for Microprocessor-Based Smart Power Applications", *IEEE Transactions on Electron Devices*, 42, 564-570, (Mar. 1995).

Verdonckt-Vanderbroek, S., et al., "High-Gain Lateral Bipolar Action in a MOSFET Structure", *IEEE Transactions on Electron Devices 38*, 2487-2496, (Nov. 1991).

Vittal, A., et al., "Clock Skew Optimization for Ground Bounce Control", *1996 IEEE/ACM International Conference on Computer-Aided Design, Digest of Technical Paper*, San Jose, CA, 395-399, (Nov. 10-14, 1996).

Wang, N., *Digital MOS Integrated Circuits*, Prentice Hall, Inc., Englewood Cliffs, NJ, p. 328-333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369-3373, (Jun. 1996).

Watanabe, H., et al., "A New Cylindrical Capacitor Using Hemisperical Grained Si (HSG-Si) for 256Mb DRAM's", *IEEE International Electron Devices Meeting, Technical Digest*, San Francisco, CA 259-262, (Dec. 13-16, 1992).

Watanabe, H., et al., "A Novel Stacked Capacitor with Porous-Si Electrodes for High Density DRAMs", *1993 Symposium on VLSI Technology, Digest of Technical Papers*, Kyoto, Japan, 17-18, (1993).

Watanabe, H., et al., "An Advanced Fabrication Technology of Hemispherical Grained (HSG) Poly-Si for High Capacitance Storage Electrodes", *Extended Abstracts of the 1991 International Conference on Solid State Devices and Materials*, Yokohama, Japan, 478-480, (1991).

Watanabe, H., et al., "Device Applications and Structure Observation for Hemispherical-Grained Si", *J. Appl. Phys.*, 71, 3538-3543, (Apr. 1992).

Watanabe, H., et al., "Hemispherical Grained Silicon (HSG-Si) Formation on In-Situ Phosphorous Doped Amorphous-Si Using the Seeding Method", *Extended Abstracts of the 1992 International Conference on Solid State Devices and Materials*, Tsukuba, Japan, 422-424, (1992).

Watanabe, S., et al., "A Novel Circuit Technology with Surrounding Gate Transistors (SGT's) for Ultra High Density DRAM's", *IEEE Journal of Solid-State Circuits*, 30, 960-971, (Sep. 1995).

Wooley, et al., "Experimental Results and Modeling Techniques for Substrate Noise in Mixed Signal Integrated Circuits", *IEEE Journal of Solid State Circuits*, vol. SC-28, 420-30, (1993).

Yamada, T., et al., "A New Cell Structure with a Spread Source/Drain (SSD) MOSFET and a Cylindrical Capacitor for 64-Mb DRAM's", *IEEE Transactions on Electron Devices*, 38, 2481-2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35-38, (Dec. 3-6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240-241, (Jun. 11-13, 1996).

Wolf, Stanley, "Isolation Technolgies for Intergrated Circuits", *Silicon Processing for the NLSI Era vol. 2 Process Integration*, (1990),66-78.

\* cited by examiner

CIRCUITS WITH A TRENCH CAPACITOR HAVING MICRO-ROUGHENED SEMICONDUCTOR SURFACES

This application is a Divisional of U.S. application Ser. No. 09/010,729, filed Jan. 22, 1998, now U.S. Pat. No. 6,025,225.

TECHNICAL FIELD OF THE INVENTION

The present invention relates generally to the field of integrated circuits and, in particular, to circuits with a trench capacitor having micro-roughened semiconductor surfaces and methods for forming the same.

BACKGROUND OF THE INVENTION

Electronic systems, such as microprocessor based computers, typically operate on data that is stored in electronic form in a memory device. The memory device stores the data at specified voltage levels in an array of cells. Conventionally, the voltage levels represent that the data is either a logical "1" or a logical "0." In dynamic random access memory (DRAM) devices, for example, the cells store the data as a charge on a capacitor. When the data is read from the memory device, sense amplifiers detect the level of charge stored on a particular capacitor so as to produce a logical "1" or a logical "0" output based on the stored charge.

As the size of memory devices decreases, the capacitor in each cell covers a smaller surface area or footprint on the substrate, chip or wafer. If the structure of the capacitor is left unchanged, these smaller capacitors cannot store as much charge because the storage capacity of a typical capacitor is proportional to the size of its storage electrodes. Unfortunately, at some point, the capacitors become too small to store sufficient charge and sense amplifiers in the memory device are unable to differentiate between charge due to noise and the charge due to data stored in the cell. This can lead to errors in the output of a memory device making the memory device useless in the electronic system.

Conventionally, memory manufacturers have used one of two types of capacitors in DRAM devices. First, many manufacturers use "stacked" capacitors to store data for the memory cell. Stacked capacitors are typically formed from polysilicon and are positioned above the conventional working surface of the semiconductor chip or wafer on which the memory device is formed. A contact couples the capacitor to a transistor in the memory cell. Some manufacturers use "trench" capacitors instead of stacked capacitors. Trench capacitors are typically formed in a trench in the semiconductor wafer or chip. The trench is filled with polysilicon that acts as one plate of the capacitor. In this case, the semiconductor wafer or chip acts as the second plate of the capacitor.

Designers have experimented with various configurations of capacitors, both stacked and trench, to maintain the capacitance as the footprint available for the capacitor decreases. In the area of stacked capacitors, designers have used texturization, stacked V-shaped plates and other shaped plates to increase the surface area of the plates without increasing the footprint of the capacitor. For example, designers have developed techniques to produce hemispherical grains on the surface of one polysilicon plate of the stacked capacitor. This roughly doubles the storage capacity of the capacitor. Researchers have also described techniques for further increasing the surface area of the polysilicon plate, and thus the storage capacity of the capacitor, by using phosphoric acid to create pores in the polysilicon plate. See, Watanabe, *A Novel Stacked Capacitor with Porous-Si Electrodes for High Density DRAMs,* Symposium on VLSI Technology, pp. 17–18, 1993. With this technique, it is claimed that a 3.4 times increase in capacitance can be achieved.

One problem with the use of stacked capacitors is their positioning above the surface of the substrate. This positioning can interfere with the proper functioning of the equipment used to fabricate other parts of a larger circuit.

Conventionally, as the footprint available for trench capacitors has decreased, the manufacturers have used deeper trenches to maintain sufficient storage capacity of the trench capacitor. IBM has developed another technique in an attempt to maintain sufficient storage capacity as the footprint of the trench capacitor decreases. This technique uses an anodic etch to create pores in the single crystalline silicon in the trench of the trench capacitor. See, U.S. Pat. No. 5,508,542 (the '542 Patent). One problem with this technique is the lack of control over the distribution of the pores in the surface of the single crystalline silicon. Thus, the '542 Patent does not provide a technique that can be used reliably for large scale production of memory devices.

For the reasons stated above, and for other reasons stated below which will become apparent to those skilled in the art upon reading and understanding the present specification, there is a need in the art for a realizable trench capacitor with increased surface area compared to prior art capacitors for use in high-density circuits such as dynamic random access memories.

SUMMARY OF THE INVENTION

The above mentioned problems with integrated circuits and other problems are addressed by the present invention and which will be understood by reading and studying the following specification. A trench capacitor with increased surface area is described which is formed by depositing a layer of polysilicon in a trench in a semiconductor substrate and etching the polysilicon to produce a porous surface for the trench capacitor.

In particular, an illustrative embodiment of the present invention includes a method for forming a trench capacitor. The method includes forming a trench in a semiconductor substrate. A conformal layer of semiconductor material is deposited in the trench. The surface of the conformal layer of semiconductor material is roughened. An insulator layer is formed outwardly from the roughened, conformal layer of semiconductor material. A polycrystalline semiconductor plate is formed outwardly from the insulator layer in the trench.

In another embodiment, a method for forming a memory cell with a trench capacitor is provided. The method includes forming a transistor including first and second source/drain regions, a body region and a gate in a layer of semiconductor material on a substrate. Further, a trench is formed in the layer of semiconductor material and a conformal layer of semiconductor material is formed in the trench. The surface of the conformal layer of semiconductor material is roughened and an insulator layer is formed outwardly from the roughened, conformal layer of semiconductor material. A polycrystalline semiconductor plate is formed outwardly from the insulator layer in the trench such that the polycrystalline semiconductor plate forms one of the plates of the trench capacitor. The trench capacitor is coupled to one of the first source/drain regions of the transistor.

In another embodiment, a memory cell is provided. The memory cell includes a lateral transistor formed in a layer of semiconductor material outwardly from a substrate. The transistor includes a first source/drain region, a body region and a second source/drain region. A trench capacitor is formed in a trench and coupled to the first source/drain region. The trench capacitor includes a polycrystalline semiconductor plate formed in the trench that is coupled to the first source/drain region. The trench capacitor also includes a second plate formed by the substrate with a surface of the substrate in the trench roughened by etching a polycrystalline semiconductor material on the surface of the substrate. The trench capacitor also includes an insulator layer that separates the polycrystalline semiconductor plate from the roughened surface of the substrate.

In another embodiment, a memory cell is provided. The memory cell includes a vertical transistor that is formed outwardly from a substrate. The transistor includes a first source/drain region, a body region and a second source/drain region that are vertically aligned. A surface of the first source/drain region is roughened by etching a polycrystalline semiconductor material on a surface of the first source/drain region. A trench capacitor is also included. The trench capacitor includes a plate that is formed in a trench that surrounds the roughened surface of the first source/drain region of the transistor.

In another embodiment, a memory device is provided. The memory device includes an array of memory cells. Each memory cell includes an access transistor that is coupled to a trench capacitor. A first plate of the trench capacitor includes a micro-roughened surface of porous polysilicon. A second plate of the trench capacitor is disposed adjacent to the first plate. A number of bit lines are each selectively coupled to a number of the memory cells at a first source/drain region of the access transistor. A number of word lines are disposed substantially orthogonal to the bit lines and are coupled to gates of a number of access transistors. A row decoder is coupled to the word lines and a column decoder is coupled to the bit lines so as to selectively access the cells of the array.

DETAILED DESCRIPTION OF THE INVENTION

In the following detailed description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
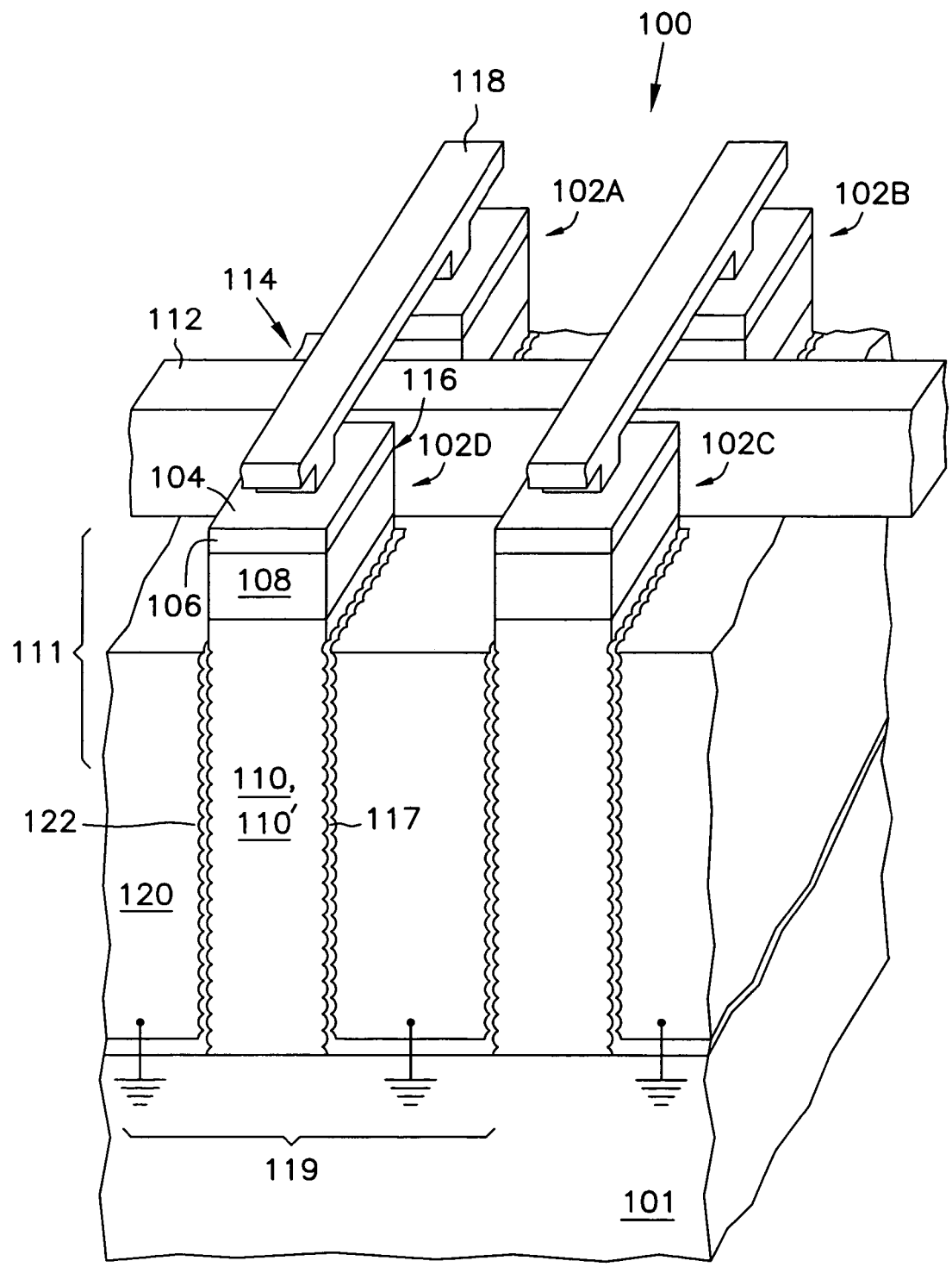
FIG. 1 is a perspective view of an embodiment of a portion of an array of memory cells according to the teachings of the present invention.

FIG. 1 is a perspective view of an embodiment of a portion of an array of memory cells indicated generally at 100 and constructed according to the teachings of the present invention. Each memory cell is constructed in a similar manner. Thus, only memory cell 102D is described herein in detail. Memory cell 102D includes pillar 104 of single crystal semiconductor material. Pillar 104 is divided into first source/drain region 106, body region 108, and second source/drain region 110 to form access transistor 111. Pillar 104 extends vertically outward from substrate 101, for example, p− silicon. First source/drain region 106 and second source/drain region 110 each comprise, for example, heavily doped n-type single crystalline silicon (N+ silicon) and body region 108 comprises lightly doped p-type single crystalline silicon (P− silicon).

Word line 112 passes body region 108 of access transistor 111 in isolation trench 114. Word line 112 is separated from body region 108 of access transistor 111 by gate oxide 116 such that the portion of word line 112 adjacent to body region 108 operates as a gate for access transistor 111. Word line 112 may comprise, for example, N+ poly-silicon material that is deposited in isolation trench 114. Cell 102D is coupled in a column with cell 102A by bit line 118.

Memory cell 102D also includes storage capacitor 119 for storing data in the cell. A first plate 110' of capacitor 119 for memory cell 102D is integral with second source/drain region 110 of access transistor 111. Thus, memory cell 102D may be more easily realizable when compared to conventional vertical transistors since there is no need for a contact between second source/drain region 110 and capacitor 119. Surface 117 of second source/drain region 110 comprises a "micro-roughened" surface. This micro-roughened surface is formed by coating second source/drain region 110 with poly-silicon and treating the poly-silicon so as to form pores in surface 117. This increases the surface area of second source/drain region 110 and, thus, increases the capacitance of capacitor 119. The pores in surface 117 can be formed, for example, using the etching techniques described below.

Second plate 120 of capacitor 119 is common to all of the capacitors of array 100. Second plate 120 comprises a mesh or grid of n+ poly-silicon formed in deep trenches that surrounds at least a portion of second source/drain region 110 of each pillars 104 in memory cells 102A through 102D. Second plate 120 is grounded by contact with substrate 101 underneath the trenches. Second plate 120 is separated from source/drain region 110 by gate insulator 122.

Figure 2:
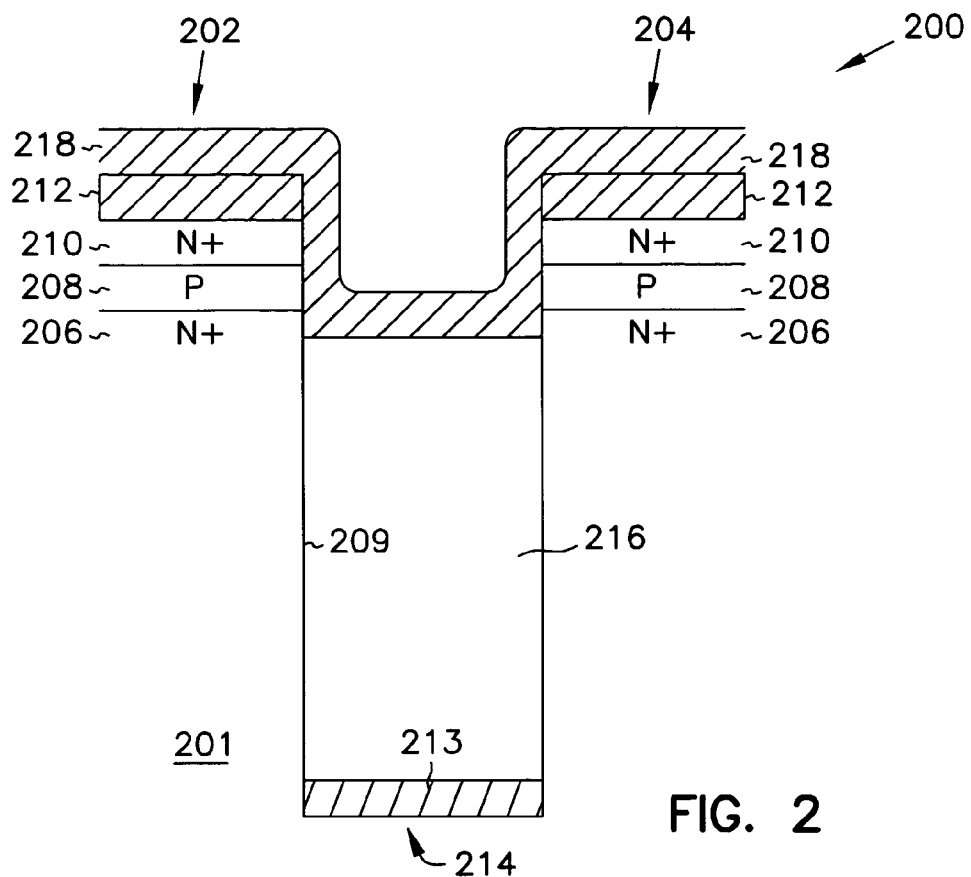
FIGS. 2, 3, 4 and 5 are cross sectional views that illustrate an embodiment of a method for forming an array of memory cells according to the teachings of the present invention.

FIGS. 2, 3, 4 and 5 are cross sectional views that illustrate an embodiment of a method for forming an array of memory cells according to the present invention. FIG. 2 is a cross sectional view that shows a portion of an array of memory cells, indicated generally at 200. Array 200 includes pillars of semiconductor material 202 and 204 that are formed either outwardly from a bulk silicon wafer or outwardly from a silicon-on-insulator (SOI) structure. Pillar 202 includes first source/drain region 206, body region 208 and second source/drain region 210. As shown, first source/drain region 206 and second source/drain region 210 comprise heavily doped n-type semiconductor material and body region 208 comprises p-type semiconductor material. Pillar 204 is similarly constructed. Pillars 202 and 204 form the basis for vertical transistors used in array 200. It is noted that the conductivity types of the various regions of the pillars can be swapped so as to allow the formation of p-channel transistors.

The silicon pillar structure of a vertical transistor of array 200 may be formed using, for example, the techniques shown and described with respect to FIGS. 5A–5J of co-pending application Ser. No. 08/944,890, entitled "Circuit and Method for an Open Bit Line Memory Cell with A Vertical Transistor and Trench Plate Trench Capacitor," filed on Oct. 6, 1997 or with respect to FIGS. 5A–5M of application Ser. No. 08/939,742, entitled "Circuit and Method for a Folded Bit Line Memory Cell with Vertical Transistors and a Trench Capacitor," filed on Oct. 6, 1997, which applications are incorporated herein by reference. Alternatively, the silicon pillars can be constructed to provide for a body contact for the transistors using techniques described with respect to FIGS. 5A–5P and 6A to 6O of co-pending, commonly assigned application Ser. No. 08/944,312, entitled "Circuit and Method for a Folded Bit Line Memory Using Trench Plate Capacitor Cells With Body Bias Contacts," filed on Oct. 6, 1997 or with respect to FIGS. 5A–5O of application Ser. No. 08/939,732, entitled "Circuit and Method for an Open Bit Line Memory Cell With A Vertical Transistor and Trench Plate Trench Capacitor," filed on Oct. 6, 1997, which applications are also incorporated herein by reference. Further, other conventional techniques for forming vertical transistors can also be used.

Once the basic silicon pillar structure is in place, surface 209 of first source/drain region 206 is roughened. Initially, nitride layer 212 ($Si_3N_4$) is deposited on silicon pillars 202 and 204. Optionally, nitride pad 213 is also deposited in trench 214 to protect the bottom of trench 214 during subsequent processing steps. For example, nitride pad 213 may be used when an SOI structure is used and the bottom of trench 214 is an insulator such as an oxide.

Trench 214 is filled with an oxide such that the entire structure of array 200 is covered. The oxide material outside of trench 214 is removed by, for example, chemical/mechanical polishing down to nitride layer 212. The oxide is further recessed into trench 214 to form oxide layer 216 as shown. Nitride masking layer 218 ($Si_3N_4$) is next deposited to protect body region 208 and second source drain region 210 during the formation of a micro-roughened surface. It is noted that masking layer 218 can be formed of any other material that can withstand a 6% aqueous solution of hydrofluoric acid (HF) or other etchant used to form a micro-roughened surface on first source/drain region 206.

Figure 3:
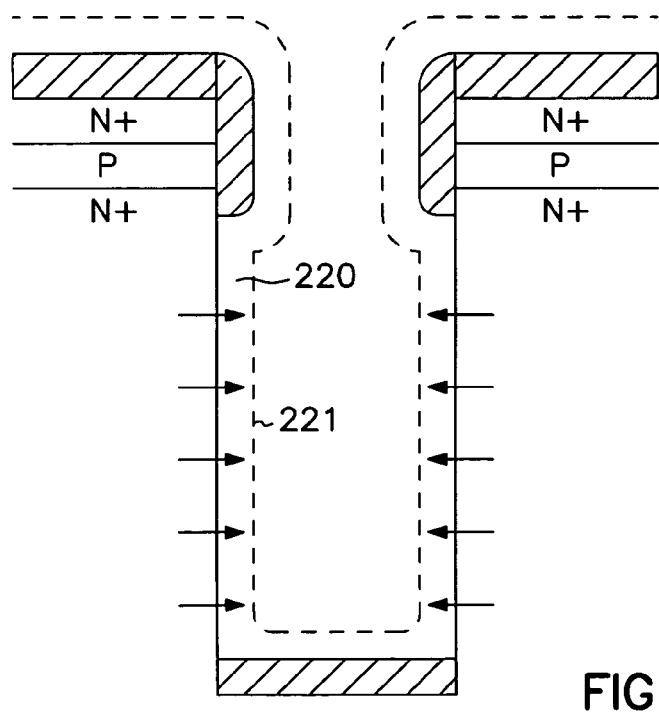

As shown in FIG. 3, nitride mask layer 218 is directionally etched to leave nitride mask layer 218 on selected surfaces of pillars 202 and 204. Oxide layer 216 is removed by, for example, an etching process. Amorphous silicon is deposited in trench 214 to form layer 220 with a thickness on the order of 10 to 40 nanometers (nm). The structure is heated to a sufficient temperature such that impurities diffuse out from first source/drain region 206 into layer 220. Thus, layer 220 becomes polysilicon that is doped to be the same conductivity type as first source/drain region 206. An etch that preferentially attacks intrinsic, undoped polysilicon is used to remove layer 220 from surfaces other than the surface of first source/drain region 206.

Figure 4:
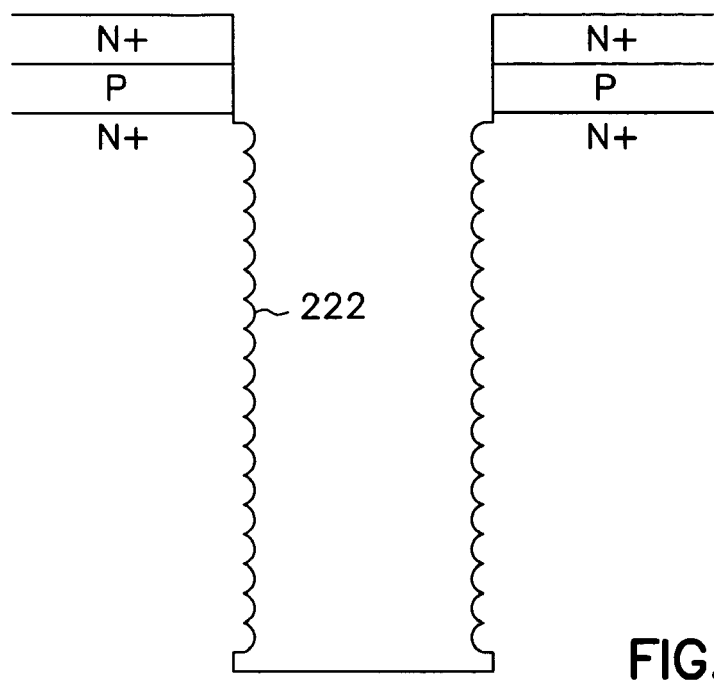

Surface 221 of layer 220 is next roughened to provide increased surface area for the trench capacitors of array 200. Surface 221 can be roughened in at least two different ways. First, layer 220 can be etched in a solution containing phosphoric acid ($H_3PO_4$). This forms micro-roughened surface 222 on polysilicon layer 220 in trench 214 as shown in FIG. 4.

Figure 5:
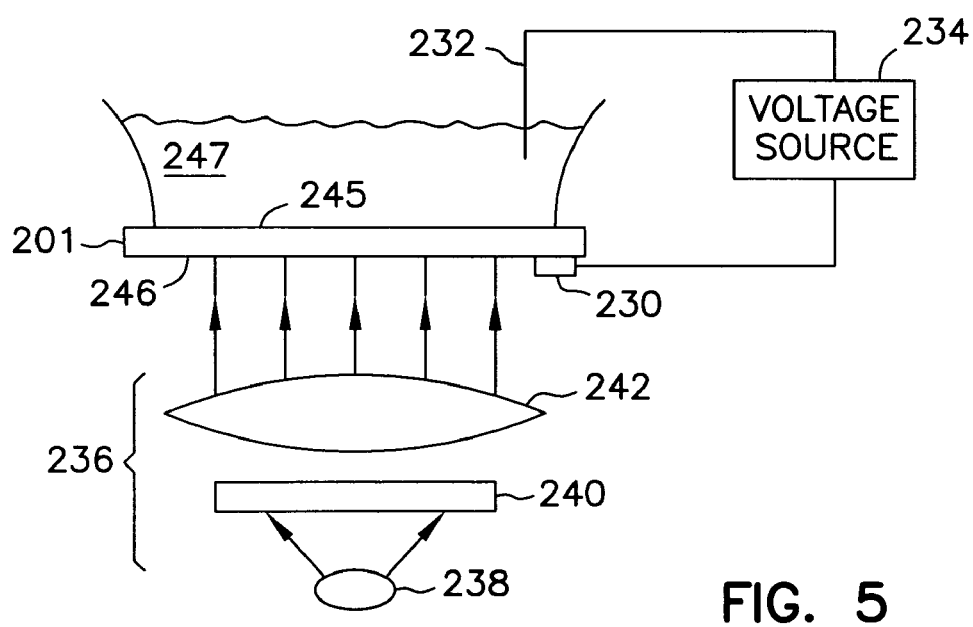

Alternatively, an anodic etch can be used to form the micro-roughened surface on layer 220. FIG. 5 is a schematic diagram that illustrates an embodiment of a layout of equipment used to carry out the anodic etch. Bottom surface 246 of semiconductor wafer 201 is coupled to voltage source 234 by positive electrode 230. Further, negative electrode 232 is coupled to voltage source 234 and is placed in a bath of 6% aqueous solution of hydrofluoric acid (HF) on surface 245 of semiconductor wafer 201. It is noted that surface 245 includes layer 220 that is to be roughened by the anodic etch.

In this example, illumination equipment 236 is also included because the surface to be roughened is n-type semiconductor material. When p-type semiconductor material is used, the illumination equipment is not required. Illumination equipment 236 assures that there is a sufficient concentration of holes in layer 220 as required by the anodic etching process. Illumination equipment 236 includes lamp 238, IR filter 240, and lens 242. Illumination equipment 236 focuses light on surface 246 of semiconductor wafer 201.

In operation, layer 220 provides a high density of nucleation sites that are used by the anodic etch to roughen the surface of layer 220. Voltage source 234 is turned on and provides a voltage across positive and negative electrodes 230 and 232. Etching current flows from positive electrode 230 to surface 245. This current forms pores in surface 221 of layer 220. Further, illumination equipment illuminates surface 246 of semiconductor wafer 201 so as to assure a sufficient concentration of holes for the anodic etching process. The anodic etching process produces a porous or roughened surface 222 on layer 220 as shown in FIG. 4 such that the effective surface area of first source/drain region 206 is increased.

The size and shape of the pores in layer 220 depends on, for example, the anodization parameters such as HF concentration, current density, and light illumination. The spatial structure of the pores reflects the available paths for the etching current to flow from surface 245 to positive electrode 230. By adjusting the anodic etching parameters, the approximate diameter of the pores can be controlled with typically the smallest pore diameter on the order of 2 nanometers.

Array 200 is completed using, for example, the techniques described in the applications incorporated by reference above.

Figure 6:
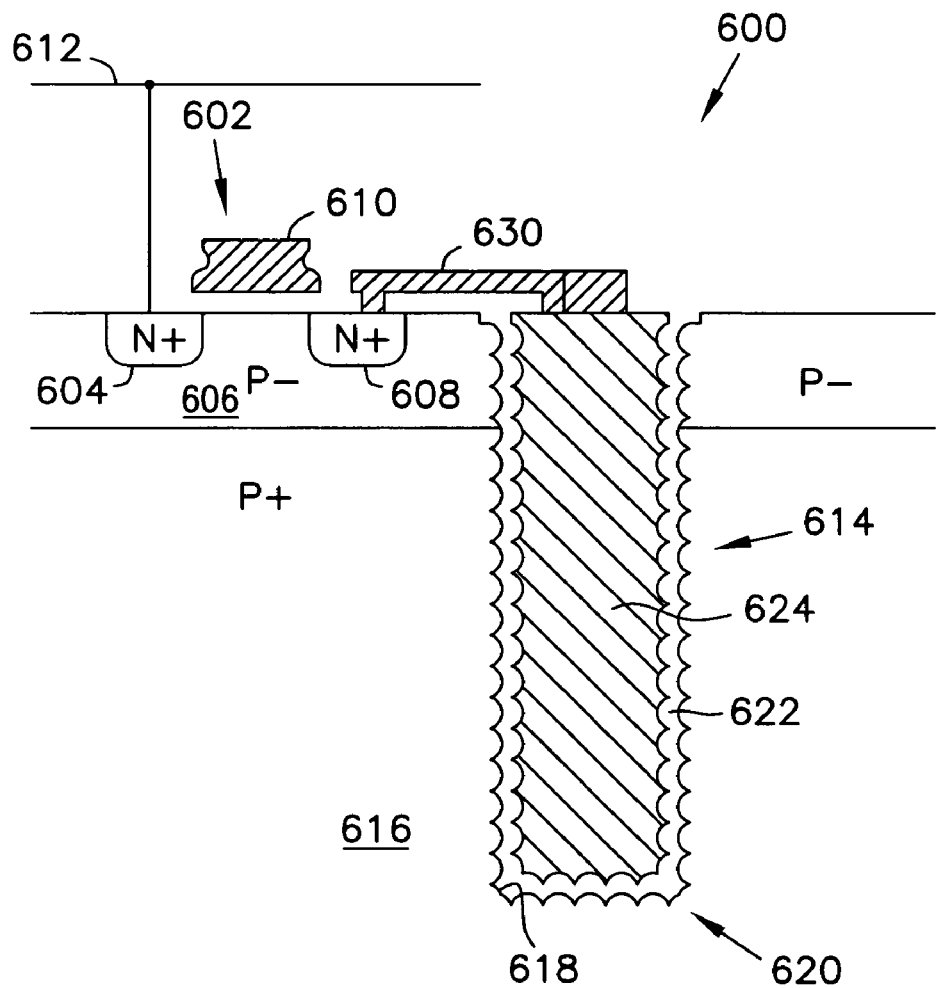
FIG. 6 is a cross sectional view of another embodiment of a memory cell according to the teachings of the present invention.

FIG. 6 is a cross sectional view of another embodiment of a memory cell according to the teachings of the present invention. Memory cell 600 includes a conventional lateral transistor 602 with first source/drain region 604, body region 606 and second source/drain region 608. Transistor 602 also includes gate 610 that may be formed as part of a word line in a memory array as is known in the art. Bit line 612 is coupled to first source/drain region 604.

Memory cell 600 also includes trench capacitor 614. Substrate 616 forms a first plate of trench capacitor 614. Surface 618 of substrate 616 in trench 620 is formed with a micro-roughened surface using, for example, one of the techniques described above by depositing and etching a polysilicon layer in trench 620. Trench capacitor 614 also includes dielectric layer 622 that separates surface 618 from second plate 624. Second plate 624 comprises, for example, poly-silicon. Substrate 616 comprises single crystal silicon. A layer of polysilicon material is deposited on a surface of the single crystal silicon of substrate 616 in forming micro-roughened surface 618. Second plate 624 of trench capacitor 614 is coupled to second source/drain region 608 by polysilicon strap 630.

In the example of FIG. 6, transistor 602 comprises an n-channel transistor with heavily doped n-type source/drain regions and a body region formed in lightly doped p-type silicon well. Further, substrate 616 comprises a heavily doped p-type semiconductor substrate. Since substrate 616 comprises p-type material, the anodic etch, without illumination, can be used to form micro-roughened surface 618.

Memory cell 600 is included in an array of similar memory cells to store and retrieve data using conventional techniques.

Figure 7:
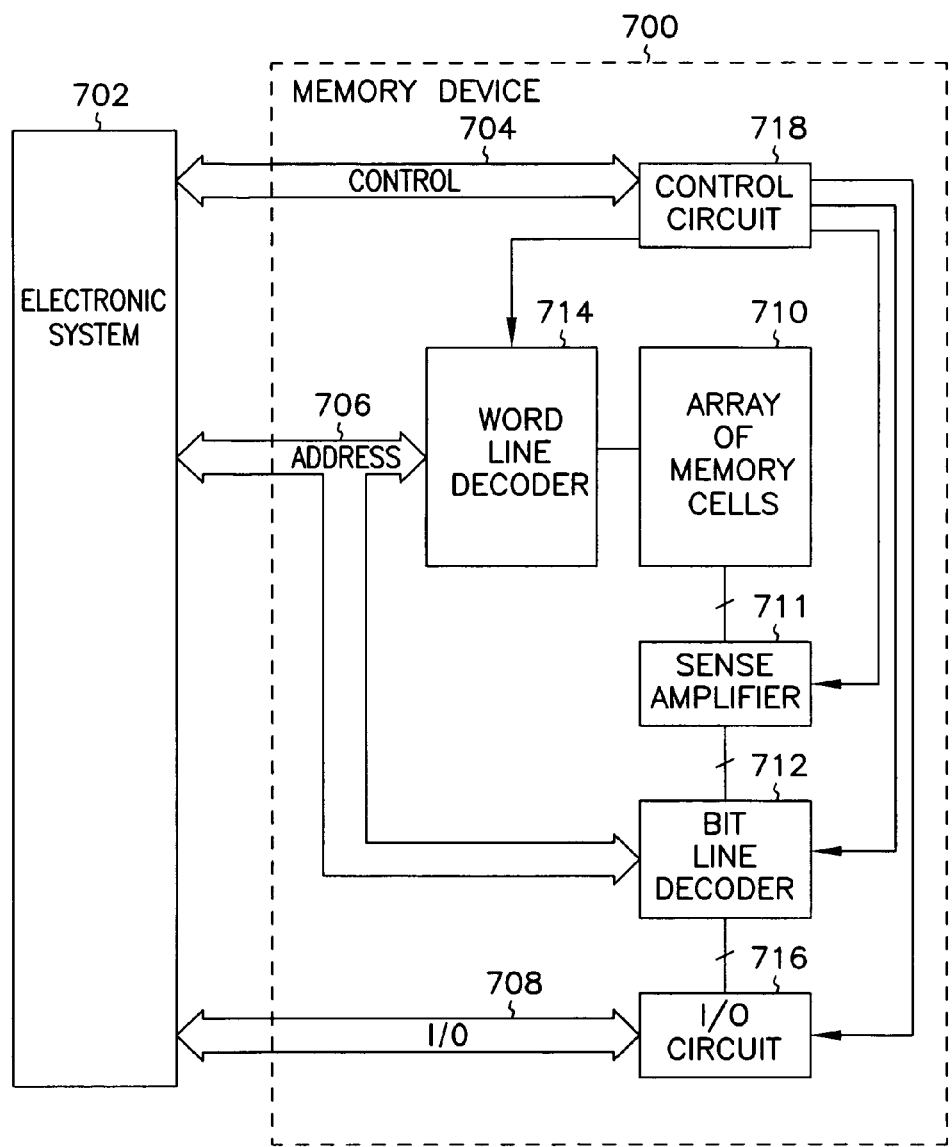
FIG. 7 is a block diagram of an embodiment of an electronic system and memory device according to the teachings of the present invention.

FIG. 7 is a block diagram of an illustrative embodiment of the present invention. This embodiment includes memory device 700 that is coupled to electronic system 702 by control lines 704, address lines 706 and input/output (I/O) lines 708. Electronic system 702 comprises, for example, a microprocessor, a processor based computer, microcontroller, memory controller, a chip set or other appropriate system for reading and writing data in a memory device. Memory device 700 includes array of memory cells 710 that is coupled to word line decoder 714 and sense amplifier 711. Array of memory cells 710 is constructed with memory cells that include trench capacitors with a micro-roughened surface that is formed using, for example, one of the techniques described above.

Word line decoder 714 includes word line drivers that are coupled to word lines of array 710. Sense amplifier 711 is coupled to bit line decoder 712. Bit line decoder 712 and word line decoder 714 are coupled to address lines 706. Bit line decoder 712 is coupled to I/O circuit 716. I/O circuit 716 is coupled to I/O lines 708. Control circuit 718 is coupled to control lines 704, sense amplifier 711, word line decoder 714, bit line decoder 712, and I/O circuit 716.

In operation, electronic system 702 provides signals on address lines 706 and control lines 704 when data is to be read from or written to a cell of array 710. Word line decoder 714 determines the word line of a selected cell of array 710 using the address provided on address lines 706. Further, bit line decoder 712 determines the bit line of the selected cell of array 710. In a read operation, sense amplifier 711 detects the value stored in the selected cell based on bit lines of array 710. Sense amplifier 711 provides this voltage to I/O circuit 716 which, in turn, passes data to electronic system 702 over I/O lines 708. In a write operation, I/O circuit 716 passes data from I/O lines 708 to sense amplifier 711 for storage in the selected cell of array 710.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the techniques for forming roughened surfaces can be applied to p-type vertical transistors. In this case, when an anodic etch is used, no light source is needed to create the roughened texture on the surface of the p-type semiconductor material. Semiconductor materials other than silicon can be used. Further, the conductivity type of the semiconductor material can be altered without departing from the teachings of the present invention.

What is claimed is:

1. A memory cell, comprising:
    a transistor formed in a layer of semiconductor material outwardly from a substrate, the transistor including a first source/drain region, a body region and a second source/drain region, that are vertically aligned;
    a trench capacitor having a second plate of polycrystalline material formed in a trench and a first plate coupled to the second source/drain region without an intervening conductor, the first plate having an etch-roughened surface, the second plate surrounding at least a portion of the first plate; and
    an insulator layer that separates the second plate from the etch-roughened surface of the first plate, wherein the transistor further includes a gate adjacent to the body region and the gate being directly above the second plate.

2. The memory cell of claim 1, wherein the second polycrystalline semiconductor plate comprises polysilicon.

3. The memory cell of claim 1, wherein the first plate comprises a heavily doped n-type silicon substrate.

4. The memory cell according to claim 1, wherein the second plate also surrounds first plates of adjacent memory cells.

5. A memory device, comprising:
    an array of memory cells, each of the memory cells including a vertical access transistor that is coupled to a trench capacitor, wherein a first plate of the trench capacitor is coupled to a second source/drain region of the vertical access transistor without an intervening conductor, the first plate including a micro-roughened surface layer of porous polysilicon, wherein the trench capacitor includes a second plate disposed adjacent to the first plate and surrounding the first plate, and wherein the vertical access transistor includes a body region vertically aligned with the second source/drain region, and a gate adjacent to the body region, the gate being directly above the second plate;
    a number of bit lines, each of the bit lines being selectively coupled to a number of the memory cells at a first source/drain region of the vertical access transistor;
    a number of word lines disposed substantially orthogonal to the bit lines and coupled to the gate of the vertical access transistor of each memory cell of the number of the memory cells; and
    a row decoder coupled to the word lines and a column decoder coupled to the bit lines for selectively accessing the array of memory cells.

6. The memory device of claim 5, wherein the first plate comprises a single crystalline layer upon which is formed the layer of polysilicon.

7. The memory device of claim 5, wherein the second plate comprises polysilicon.

8. The memory device according to claim 5, wherein the second plate also surrounds first plates of adjacent memory cells.

9. A memory cell, comprising:
a transistor formed in a layer of semiconductor material outwardly from a substrate, the transistor including a second source/drain region, a body region and a first source/drain region vertically aligned with the second source/drain region;
a trench capacitor including a first plate coupled to the second source/drain region without an intervening conductor; and
wherein the trench capacitor further includes a polysilicon second plate formed in a trench, the polysilicon second plate surrounding at least a portion of the first plate, the first plate including a surface layer of polysilicon that is etch-roughened, and an insulator layer that separates the polysilicon second plate from the etch-roughened polysilicon surface of the first plate, wherein the transistor further includes a gate adjacent to the body region and the gate being directly above the polysilicon second plate.

10. The memory cell of claim 9, wherein the first plate comprises heavily doped n-type silicon.

11. The memory cell of claim 9, wherein the second source/drain region is P-doped or N-doped.

12. The memory cell according to claim 9, wherein the second plate also surrounds first plates of adjacent memory cells.

13. A memory cell, comprising:
a vertical transistor formed outwardly from a substrate, the vertical transistor including a first source/drain region, a body region, and a second source/drain region vertically aligned with the first source/drain region and the body region; and
a trench capacitor including a single crystalline silicon first plate coupled to the second source/drain region without an intervening conductor, and a second plate formed in a trench, the first plate including a layer of polysilicon having an etch-roughened surface, the second plate surrounding at least a portion of the etch-roughened surface of the first plate; and
wherein the vertical transistor further includes a gate adjacent to the body region and the gate being directly above the second plate.

14. The memory cell according to claim 13 wherein the single crystalline polysilicon is P-doped or N-doped.

15. A memory cell, comprising:
a transistor comprising outwardly from a substrate of a second source/drain region, at least a portion of the second source/drain region serves as a single crystalline first capacitor plate of a trench capacitor for allowing the transistor to couple to the trench capacitor through a second source/drain region and the first capacitor plate without an intervening conductor, the transistor also comprising a body region, and a first source/drain region vertically aligned with the second source/drain region, wherein the first capacitor plate includes a micro-roughened surface for increasing the capacitance of the trench capacitor;
the trench capacitor being formed in a trench surrounding a portion of the transistor and including a second capacitor plate of polycrystalline material formed so as to surround the first capacitor plate; and an insulator layer that separates the second polycrystalline plate from the micro-roughened surface of the first plate, wherein the transistor further includes a gate adjacent to the body region and the gate being directly above the second plate.

16. A memory cell according to claim 15, wherein the micro-roughened surface of the first capacitor plate comprises a layer of polysilicon.

17. The memory cell according to claim 15, wherein the second source/drain region that includes the first capacitor plate, the body region, and the first source/drain region are formed as a pillar of single-crystal semiconductor material.

18. The memory cell according to claim 15, wherein the second plate also surrounds first plates of adjacent memory cells.

19. The memory cell according to claim 18, wherein the second plate is grounded.

20. A memory cell comprising:
a vertical transistor formed on a substrate, the vertical transistor including a first source/drain region, a body region, and a second source/drain region vertically aligned with the first source/drain region and the body region;
a trench capacitor including a first plate coupled to the second source/drain region without an intervening conductor, and a second plate formed in a trench and surrounding the first plate, the first plate having an etch-roughened surface, the second plate having a top surface; and
a word line for activating the vertical transistor, the word line being formed directly above the top surface of the second plate.

21. The memory cell of claim 20, wherein the first plate comprises heavily doped n-type silicon.

22. The memory cell of claim 20, wherein the second source/drain region includes one of P-doped material and N-doped material.

23. A memory device comprising:
an array of memory cells, each of the memory cells including a vertical transistor and a trench capacitor, the vertical transistor including a body region, a first source/drain region, and a second source/drain region vertically aligned with the body region and the first source/drain region, the trench capacitor including a first plate coupled to the second source/drain region without an intervening conductor, and a second plate formed in a trench and surrounding the first plate, the first plate including a micro-roughened surface of polysilicon;
a plurality of word lines for activating the vertical transistor of each of the memory cells, each of the word lines being formed directly above a top surface of the second plate of trench capacitor; and
a plurality of bit lines, each of the bit lines is coupled to a selected number of the memory cells at the first source/drain region of the vertical access transistor of each of the selected number of the memory cells.

24. The memory cell of claim 23, wherein the first plate comprises heavily doped n-type silicon.

25. The memory cell of claim 23, wherein the second source/drain region includes one of P-doped material and N-doped material.

* * * * *